United States Patent [19]

Mahabadi

[11] Patent Number: 5,329,246
[45] Date of Patent: Jul. 12, 1994

[54] CIRCUIT AND METHOD OF SETTING A BIAS POINT FOR A SINGLE-ENDED AMPLIIFIER DURING POWER-UP

[75] Inventor: John K. Mahabadi, Tempe, Ariz.

[73] Assignee: Motorola, Inc., Schaumburg, Ill.

[21] Appl. No.: 140,950

[22] Filed: Oct. 25, 1993

[51] Int. Cl.⁵ .............................................. H03F 3/26
[52] U.S. Cl. ..................................... 330/267; 330/264
[58] Field of Search ............... 330/263, 264, 267, 269, 330/273

[56] References Cited

U.S. PATENT DOCUMENTS 4,594,560  6/1988  Dingwall et al. ............... 330/267 X Primary Examiner—Steven Mottola
Attorney, Agent, or Firm—Robert D. Atkins

[57] ABSTRACT

An amplifier circuit receives biasing during power-up to reduce propagation delay. A start-up circuit generates first and second control signals upon detecting the power supply potential to the amplifier below a predetermined threshold. The control signals enable a biasing circuit to establish a bias potential at the input of the amplifier. After the power supply potential reaches the predetermined threshold, the control signals from the start-up circuit change state to disable the biasing circuit and allow the amplifier to operate normally.

10 Claims, 2 Drawing Sheets

CIRCUIT AND METHOD OF SETTING A BIAS POINT FOR A SINGLE-ENDED AMPLIIFIER DURING POWER-UP

BACKGROUND OF THE INVENTION

The present invention relates in general to amplifier circuits and, more particularly, to setting a bias operating point for a single-ended amplifier during power-up.

Amplifier circuits are commonly used in electronic circuit design for receiving a single-ended input signal and providing an amplified single-ended output signal. The single-ended amplifier may be used for detecting low-level signals as low as few millivolts. The amplifier requires a power supply potential say $V_{DD}=5.0$ volts to perform the amplification operation. The input of the amplifier circuit typically has a high input impedance and a low output impedance. The high input impedance produces a time delay for the input signal to propagate to the output especially during the time when the amplifier is powering up.

Single-ended amplifiers implemented in CMOS have an advantage of high speed operation and substantially no input offset voltage. Moreover, CMOS single-ended amplifiers have relatively simple designs requiring minimum number of transistors.

CMOS single-ended amplifiers have disadvantages such as sensitivity to noise and consumption of appreciable standby current. One way to reduce the power consumption in the CMOS single-ended amplifier is to select high impedance transistors and high value resistors. Another way of reducing power consumption is to use power cycling to shut-off the amplifier when not in use. The problem with power cycling the CMOS single-ended amplifier is the long settle-down delay due to the RC time constant at its input. A feedback resistor may be connected from the output of the amplifier back to its input for establishing a DC bias at both input and output terminals. The DC bias varies according to variations in thresholds and power supply potential. The self-bias level at the input of the amplifier does not reach an operational point until the amplifier powers up which may take several milliseconds. It is desirable to allow the input signal to propagate through the amplifier as rapidly as possible even during power-up.

Hence, a need exists to minimize the propagation delay during power-up and to isolate the supply noise from reaching the amplifier input.

DETAILED DESCRIPTION OF THE PREFERRED EMBODIMENT

Figure 1:
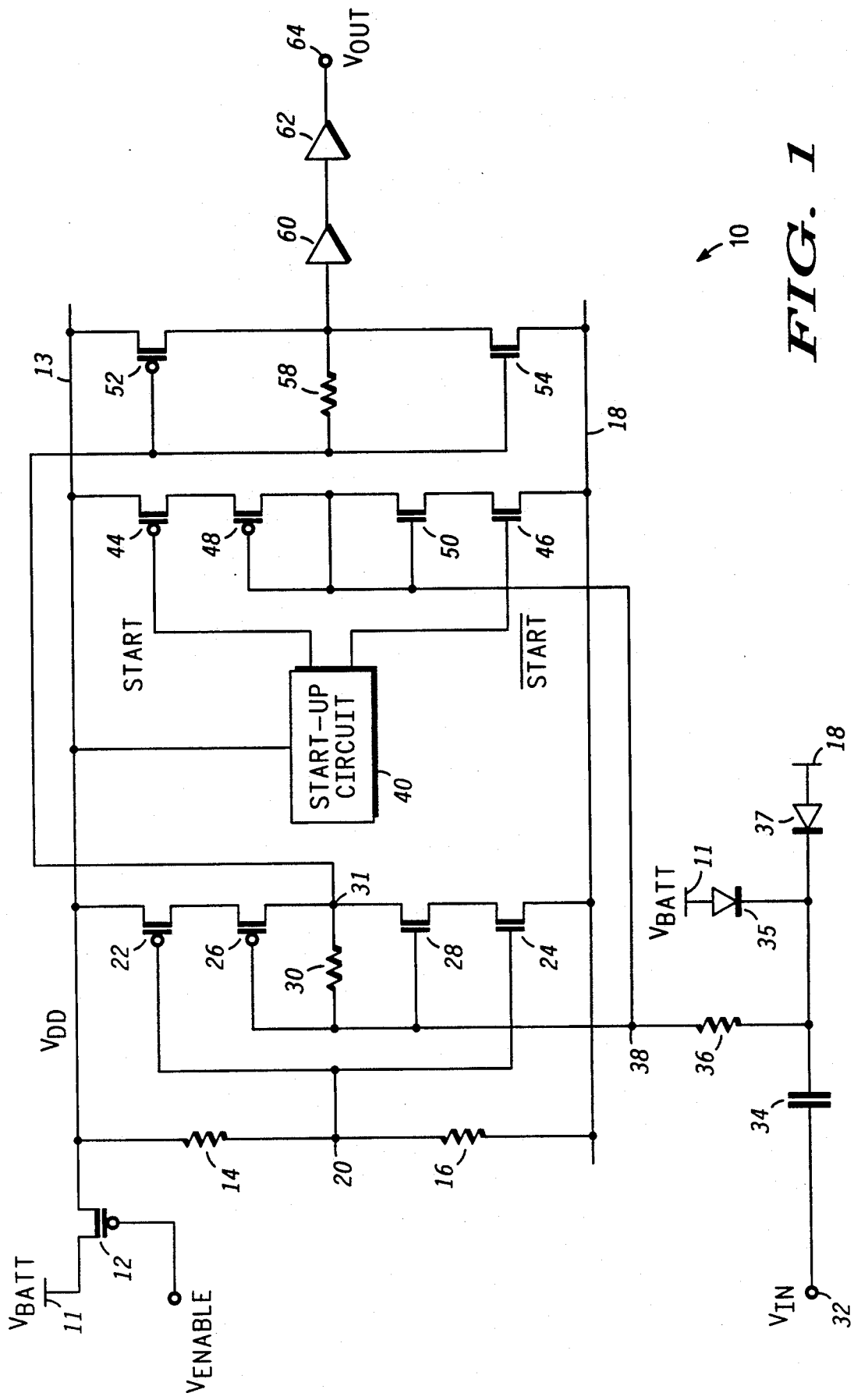
FIG. 1 is a schematic diagram illustrating an amplifier circuit with power cycling feature.

A CMOS single-ended amplifier circuit 10 is shown in FIG. 1 suitable for manufacturing as an integrated circuit using conventional integrated circuit processes. FIG. 1 represents a simplified diagram of the CMOS low-power single-ended amplifier with power cycling and noise rejection features.

A power supply conductor 11 operating a positive potential $V_{BATT}$ such as 5 volts from a battery source is coupled to the source of transistor 12. Transistor 12 passes the power supply potential $V_{BATT}$ to power supply conductor 13 noted as power supply potential $V_{DD}$ upon receiving control signal $V_{ENABLE}$ at its gate. A logic zero control signal $V_{ENABLE}$ enables transistor 12 to supply power to amplifier 10 during normal operation while a logic one control signal $V_{ENABLE}$ disables amplifier 10 to conserve power when not in use. The power supply potential $V_{DD}$ is substantially equal to power supply potential $V_{BATT}$ when transistor 12 is enabled. Resistors 14 and 16 are serially coupled between power supply conductor 13 and power supply conductor 18 operating at ground potential for generating a reference voltage $V_{REF}$ at node 20. Resistors 14 and 16 may be selected at 200 K ohms each to produce a reference voltage $V_{REF}$ operating at say 2.5 volts. The reference voltage $V_{REF}$ is applied to the gates of transistors 22 and 24 to operate in their linear resistive region. The source of transistor 22 is coupled to power supply conductor 13 while the source of transistor 24 is coupled to power supply conductor 18. The drain of transistor 22 is coupled to the source of transistor 26 while the drain of transistor 24 is coupled to the source of transistor 28. Transistors 22 and 24 isolate any power supply noise on power supply conductors 13 and 18 from coupling to the input of amplifier 10. The gates of transistors 26 and 28 are coupled to their drains by way of feedback resistor 30 at node 31. A low-level (5 mv) single-ended analog input signal $V_{IN}$ applied at input terminal 32 propagates through serially coupled capacitor 34 and resistor 36 to node 38 at the gates of transistors 26 and 28. Capacitor 34 AC-couples the input signal $V_{IN}$ to the input of amplifier 10. Diode 35 is coupled between power supply conductor 11 and the interconnection of capacitor 34 and resistor 36. Diode 37 is coupled between power supply conductor 18 and the interconnection of capacitor 34 and resistor 36. Diodes 35 and 37 and resistor 36 provide ESD protection for transistors 26 and 28.

As part of the present invention, start-up circuit 40 generates complementary control signals START and $\overline{START}$ to the gates of transistors 44 and 46, respectively. The source of transistor 44 is coupled to power supply conductor 13 while the source of transistor 46 is coupled to power supply conductor 18. The drain of transistor 44 is coupled to the source of transistor 48 while the drain of transistor 46 is coupled to the source of transistor 50. The gates of transistors 48 and 50 are coupled to the drains of the same and are further coupled to node 38. The combination of start-up circuit 40 and biasing circuit 44–50 develop a self-bias potential at node 38 during power up to stabilize the operation of amplifier 10 and allow the input signal $V_{in}$ to propagate through amplifier 10 with reduced time delay.

The output of the amplifier section formed of transistors 22–28 at node 31 is coupled to the gates of transistors 52 and 54. The source of transistor 52 is coupled to power supply conductor 13 while the source of transistor 54 is coupled to power supply conductor 18. The gates of transistors 52 and 54 are coupled through feedback resistor 58 to their drains at the input of buffer 60. Transistors 52, 54 and feedback resistor 58 further amplify the signal from node 31. The output of buffer 60 is coupled to the input of buffer 62 for providing a digital output signal $V_{OUT}$ of amplifier 10 at output terminal 64. Buffers 60 and 62 convert the amplified signal to the digital signal $V_{OUT}$.

Figure 2:
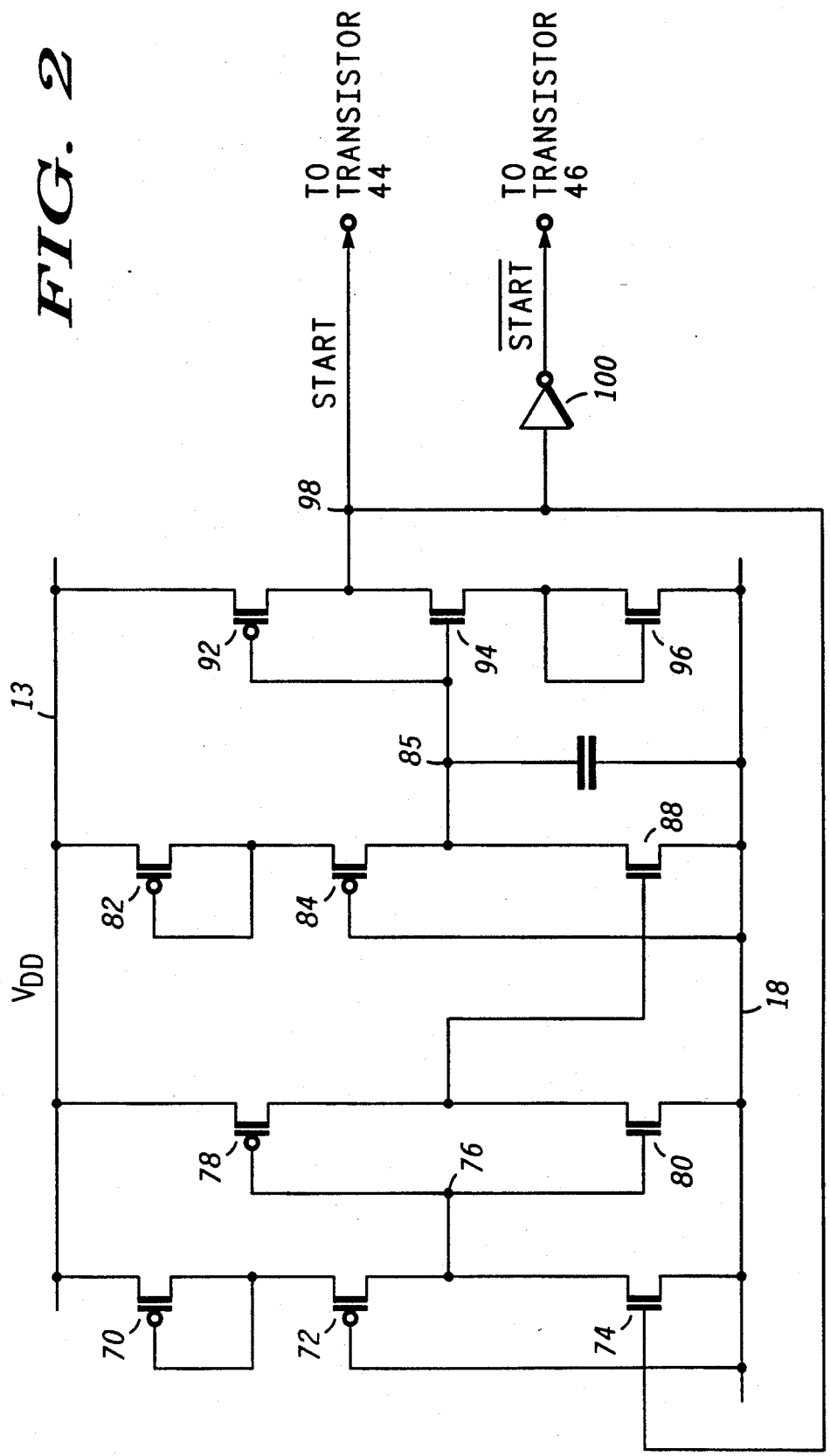
FIG. 2 is a schematic diagram illustrating the start-up circuit of FIG. 1.

Turning to FIG. 2, further detail of start-up circuit 40 is shown including transistor 70 having a source coupled to power supply conductor 13 and a gate and drain coupled together to the source of transistor 72. The gate of transistor 72 receives ground potential from power supply conductor 18. The drain of transistor 72 is coupled to the drain of transistor 74 at node 76. Transistor 74 includes a source coupled to power supply conductor 18. Transistors 70, 72 and 74 form a $V_{DD}$ threshold detector at node 76. Transistors 78 and 80 include gates coupled together to node 76 and sources coupled to power supply conductors 13 and 18, respectively. The drains of transistors 78 and 80 are coupled together to the gate of transistor 88. Transistors 78 and 80 operate as a CMOS inverter for turning off transistor 88 after the $V_{DD}$ threshold is reached at node 76. The source of transistor 88 is coupled to power supply conductor 18, and the drain of transistor 88 is coupled to the drain of transistor 84 at node 85. The gate of transistor 84 is coupled to power supply conductor 18 while its source is coupled to the gate and drain of transistor 82. The source of transistor 82 is coupled to power supply conductor 13. Capacitor 90 is coupled between node 85 and power supply conductor 18. Transistors 82 and 84 supply charging current into timing capacitor 90. Capacitor 90 is made of poly1 and poly2 plates. Transistors 92 and 94 have their gates coupled together to node 85 and their drains coupled together to node 98. The source of transistor 92 is coupled to power supply conductor 13, while the source of transistor 94 is coupled to the drain and gate of transistor 96. The source of transistor 96 is coupled to power supply conductor 18. Transistors 92, 94 and 96 invert the signal at node 85 for providing the START control signal at node 98 to the gate of transistor 44 of FIG. 1. Node 98 is coupled to the gate of transistor 74 and to the input of inverter 100 for providing the $\overline{START}$ control signal to the gate of transistor 46 of FIG. 1. All transistors shown in FIGS. 1 and 2 may be CMOS enhancement type transistors.

The operation of amplifier 10 proceeds as follows. Referring to FIG. 1, normal operation of the CMOS low-power single-ended amplifier 10 is described by assuming $V_{ENABLE}$ at logic zero with transistor 12 conducting. Power supply conductor 13 assumes a power supply level substantially equal to power supply potential $V_{BATT}$. The reference signal $V_{REF}$ at node 20 turns on transistors 22 and 24 to their linear resistive region. Transistors 22 and 24 are large in size having a low voltage drop cross their source-drain junction. Nodes 31 and 38 operate at the same DC level which was established by the threshold of transistors 26, 28 and feedback resistor 30. The small input signal $V_{IN}$ is coupled to node 38 through AC-coupling capacitor 34 and resistor 36. The amplified signal at node 31 is applied into a second gain stage comprising transistors 52, 54 and feedback resistor 58. Buffers 60 and 62 produce the digital output signal at output terminal 64. During normal operation, transistors 44 and 46 are non-conductive resulting in no DC current flowing through transistors 48 and 50.

Any variation on the power supply potential $V_{DD}$ is reflected on reference voltage $V_{REF}$. A voltage drop in power supply potential $V_{DD}$ causes a proportional drop at node 20 and has minimum effect on the gate-to-source junction potential $V_{GS}$ of transistor 22. This is a great advantage in preventing a sudden interruption in the amplifier current due to noise or drop in the power supply voltage.

The power cycling feature of amplifier 10 is described by assuming transistors 12, 44 and 46 are initially off. The average power consumption of amplifier 10 may be reduced by turning off transistor 12 and disabling power supply potential $V_{DD}$. The gate of transistor 12 is at the level of power supply potential $V_{BATT}$, i.e. logic one. When it comes time to operate amplifier 10, the $V_{ENABLE}$ switches from logic one to logic zero. Transistor 12 turns on and power supply conductor 13 rises toward power supply potential $V_{BATT}$.

At this time, start-up circuit 40 generates a short duration complementary START and $\overline{START}$ control signals as logic zero and logic one to the gates of transistors 44 and 46, respectively. Transistors 44 and 46 turn on while START and $\overline{START}$ are asserted causing a self-bias DC voltage to develop at node 38. Transistors 22, 26, 28 and 24 are similar thresholds as transistors 44, 48, 50 and 46. The input and output of transistors 48 and 50 are shorted together causing a low impedance at node 38. The RC time constant due to resistors 30 and 36 and capacitor 34 is thus reduced at node 38. This reduces the propagation delay through amplifier 10 during power-up. Node 38 reaches the amplifier self-bias level during the START and $\overline{START}$ control signals allowing the input signal $V_{IN}$ to superimpose on the amplifier DC bias. When the power supply potential $V_{DD}$ reaches full operational levels, start-up circuit 40 switches the START and $\overline{START}$ control signals to logic one and logic zero, respectively, thereby turning off transistors 44 and 46. The power-up biasing circuit 40, 44–50 is thus removed from the circuit operation. Amplifier 10 begins normal operation.

Referring to FIG. 2, transistor 70 is a diode-connected p-channel device. Transistor 72 is biased at its linear resistive region. Therefore, node 76 tracks power supply potential $V_{DD}$ less the thresholds of transistor 70 and the source-drain voltage of transistor 72. Transistor 78 conducts to turn on transistor 88 and pull node 85 to logic zero. Transistor 92 turns on to allow node 98 to follow the rise in power supply potential $V_{DD}$ toward logic one. When node 98 reaches a logic one level, the START control signal becomes logic one and the $\overline{START}$ control signal goes to logic zero at the output of inverter 100 to enable transistors 44 and 46 of FIG. 1. The logic one START signal turns on transistor 74 upon reaching its threshold thereby setting up a voltage divider at node 76 between transistors 70–72 and transistor 74.

After power supply potential $V_{DD}$ on power supply conductor 13 reaches a predetermined threshold, say 1.5 volts, the voltage at node 76 turns on transistor 80. Transistor 88 turns off allowing capacitor 90 to charge. Diode-connected transistor 82 and resistive-connected transistor 84 charges capacitor 90. Transistor 96 is diode-connected for increasing the threshold at the inverting stage of transistors 92, 94 and 96. At the time that capacitor 90 charge reaches the threshold level of transistors 94 and 96, node 98 switches to logic zero. The START control signal goes to logic zero and the $\overline{START}$ control signal goes to logic one at the output of inverter 100 to disables transistors 44 and 46 of FIG. 1. Transistors 74 and 88 also turn off inhibiting DC current flow between power supply conductors 13 and 18. The pulse width of the START and $\overline{START}$ are determined by the current flows from transistors 82, 84 and the value of capacitor 90.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An amplifier circuit having an input responsive to an input signal for providing an output signal, comprising:

first means for generating first and second control signals upon detecting a first power supply potential below a predetermined threshold, said first and second control signals having opposite phase; and second means responsive to said first and second control signals for establishing a bias potential at the input of the amplifier, said second means including, (a) a first transistor having a gate, a source and a drain, said source receiving said first power supply potential, said gate receiving said first control signal, (b) a second transistor having a gate, a source and a drain, said source being coupled to said drain of said first transistor, said gate and drain being coupled together to the input of the amplifier circuit for establishing said bias potential, (c) a third transistor having a gate, a source and a drain, said gate and drain being coupled together to the input of the amplifier circuit, and (d) a fourth transistor having a gate, a source and a drain, said drain being coupled to said source of said third transistor, said gate receiving said second control signal from said first means, said source receiving a second power supply potential.

2. The amplifier circuit of claim 1 wherein said first means includes:

a first transistor having a gate, a source and a drain, said source receiving said first power supply potential;

a second transistor having a gate, a source and a drain, said source being coupled to said gate and drain of said first transistor, said gate receiving a second power supply potential;

a third transistor having a gate, a source and a drain, said drain being coupled to said drain of said second transistor, said gate receiving said first control signal, said source receiving said second power supply potential;

a fourth transistor having a gate, a source and a drain, said source receiving said first power supply potential, said gate being coupled to said drains of said second and third transistors; and a fifth transistor having a gate, a source and a drain, said drain being coupled to said drain of said fourth transistor, said gates of said fourth and fifth transistors being coupled to said drains of said second and third transistors, said source receiving said second power supply potential.

3. The amplifier circuit of claim 2 wherein said first means further includes:

a sixth transistor having a gate, a source and a drain, said source receiving said first power supply potential;

a seventh transistor having a gate, a source and a drain, said source being coupled to said gate and drain of said sixth transistor, said gate receiving said second power supply potential;

an eighth transistor having a gate, a source and a drain, said drain being coupled to said drain of said seventh transistor, said gate being coupled to said drains of said fourth and fifth transistors, said source receiving said second power supply potential;

a capacitor coupled between said drain of said eighth transistor and said second power supply potential;

a ninth transistor having a gate, a source and a drain, said source receiving said first power supply potential;

a tenth transistor having a gate, a source and a drain, said drain being coupled to said drain of said ninth transistor for providing said first control signal, said gates of said ninth and tenth transistors being coupled together to said drain of said eighth transistor;

an eleventh transistor having a gate, a source and a drain, said gate and drain being coupled together to said source of said tenth transistor, said source receiving said second power supply potential; and an inverter having an input coupled to said drains of said ninth and tenth transistors and having an output for providing said second control signal.

4. The amplifier circuit of claim 1 further including:

a fifth transistor having a gate, a source and a drain, said source receiving said first power supply potential;

a sixth transistor having a gate, a source and a drain, said source being coupled to said drain of said fifth transistor, said gate receiving the input signal of the amplifier circuit, said drain being coupled to a first node;

a seventh transistor having a gate, a source and a drain, said drain being coupled to said first node, said gate receiving the input signal of the amplifier circuit;

a first resistor coupled between the input of the amplifier circuit and said first node; and an eighth transistor having a gate, a source and a drain, said drain being coupled to said source of said seventh transistor, said gates of said fifth and eighth transistors receiving a reference potential, said source receiving said second power supply potential.

5. The amplifier circuit of claim 4 further including:

a ninth transistor having a gate, a source and a drain, said source receiving said first power supply potential, said gate being coupled to said first node;

a tenth transistor having a gate, a source and a drain, said drain being coupled to said drain of said ninth transistor, said gate being coupled to said first node, said source receiving said second power supply potential;

a second resistor coupled between said gates of said ninth and tenth transistors and said drains of said ninth and tenth transistors;

a first buffer having an input coupled to said drains of said ninth and tenth transistors and having an output; and a second buffer having an input coupled to said output of said first buffer and having an output for providing the output signal of the amplifier circuit.

6. An amplifier circuit having an input responsive to an input signal for providing an output signal, comprising:

first means for generating a first control signal upon detecting a first power supply potential below a predetermined threshold;

a first transistor having a gate, a source and a drain, said source receiving said first power supply potential, said gate receiving said first control signal;

a second transistor having a gate, a source and a drain, said source being coupled to said drain of said first transistor, said gate and drain being coupled together to the input of the amplifier circuit for establishing a bias potential;

a third transistor having a gate, a source and a drain, said gate and drain being coupled together to the input of the amplifier circuit; and a fourth transistor having a gate, a source and a drain, said drain being coupled to said source of said third transistor, said gate receiving a second control signal from said first means, said source receiving a second power supply potential.

7. The amplifier circuit of claim 6 wherein said first means includes:

a first transistor having a gate, a source and a drain, said source receiving said first power supply potential;

a second transistor having a gate, a source and a drain, said source being coupled to said gate and drain of said first transistor, said gate receiving said second power supply potential;

a third transistor having a gate, a source and a drain, said drain being coupled to said drain of said second transistor, said gate receiving said first control signal, said source receiving said second power supply potential;

a fourth transistor having a gate, a source and a drain, said source receiving said first power supply potential, said gate being coupled to said drains of said second and third transistors; and a fifth transistor having a gate, a source and a drain, said drain being coupled to said drain of said fourth transistor, said gates of said fourth and fifth transistors being coupled to said drains of said second and third transistors, said source receiving said second power supply potential.

8. The amplifier circuit of claim 7 wherein said first means further includes:

a sixth transistor having a gate, a source and a drain, said source receiving said first power supply potential;

a seventh transistor having a gate, a source and a drain, said source being coupled to said gate and drain of said sixth transistor, said gate receiving said second power supply potential;

an eighth transistor having a gate, a source and a drain, said drain being coupled to said drain of said seventh transistor, said gate being coupled to said drains of said fourth and fifth transistors, said source receiving said second power supply potential;

a capacitor coupled between said drain of said eighth transistor and said second power supply potential;

a ninth transistor having a gate, a source and a drain, said source receiving said first power supply potential;

a tenth transistor having a gate, a source and a drain, said drain being coupled to said drain of said ninth transistor for providing said first control signal, said gates of said ninth and tenth transistors being coupled together to said drain of said eighth transistor;

an eleventh transistor having a gate, a source and a drain, said gate and drain being coupled together to said source of said tenth transistor, said source receiving said second power supply potential; and an inverter having an input coupled to said drains of said ninth and tenth transistors and having an output for providing said second control signal.

9. The amplifier circuit of claim 6 further including:

a fifth transistor having a gate, a source and a drain, said source receiving said first power supply potential;

a sixth transistor having a gate, a source and a drain, said source being coupled to said drain of said fifth transistor, said gate receiving the input signal of the amplifier circuit, said drain being coupled to a first node;

a seventh transistor having a gate, a source and a drain, said drain being coupled to said first node, said gate receiving the input signal of the amplifier circuit;

a first resistor coupled between the input of the amplifier circuit and said first node; and an eighth transistor having a gate, a source and a drain, said drain being coupled to said source of said seventh transistor, said gates of said fifth and eighth transistors receiving a reference potential, said source receiving said second power supply potential.

10. The amplifier circuit of claim 9 further including:

a ninth transistor having a gate, a source and a drain, said source receiving said first power supply potential, said gate being coupled to said first node;

a tenth transistor having a gate, a source and a drain, said drain being coupled to said drain of said ninth transistor, said gate being coupled to said first node, said source receiving said second power supply potential;

a second resistor coupled between said gates of said ninth and tenth transistors and said drains of said ninth and tenth transistors;

a first buffer having an input coupled to said drains of said ninth and tenth transistors and having an output; and a second buffer having an input coupled to said output of said first buffer and having an output for providing the output signal of the amplifier circuit.

* * * * *